United States Patent
Tran (10) Patent No.: US 6,356,477 B1
(45) Date of Patent: Mar. 12, 2002

(54) CROSS POINT MEMORY ARRAY INCLUDING SHARED DEVICES FOR BLOCKING SNEAK PATH CURRENTS

(75) Inventor: Lung T. Tran, Saratoga, CA (US)

(73) Assignee: Hewlett Packard Company, Palo Alto, CA (US)

( * ) Notice: Subject to any disclaimer, the term of this patent is extended or adjusted under 35 U.S.C. 154(b) by 0 days.

(21) Appl. No.: 09/771,857

(22) Filed: Jan. 29, 2001

(51) Int. Cl.[7] .............................................. G11C 11/00
(52) U.S. Cl. ........................................ 365/158; 365/171
(58) Field of Search ................ 365/158, 157, 365/171, 173

(56) References Cited

U.S. PATENT DOCUMENTS

| | | | |
|---|---|---|---|
| 5,640,343 A | 6/1997 | Gallagher et al. ......... 365/171 |
| 6,097,625 A | 8/2000 | Scheuerlein ............... 365/171 |
| 6,130,835 A | * 10/2000 | Scheuerlein ............... 365/171 |
| 6,191,972 B1 | * 2/2001 | Miura et al. ............... 365/171 |
| 6,215,707 B1 | * 4/2001 | Moyer ....................... 365/173 |
| 6,256,224 B1 | * 7/2001 | Perner et al. .............. 365/173 |
| 6,256,247 B1 | * 7/2001 | Perner ....................... 365/173 |

\* cited by examiner

Primary Examiner—Tan T. Nguyen

(57) ABSTRACT

An information storage device includes a resistive cross point array of memory elements and a plurality of devices (e.g., diodes, transistors) for blocking sneak path currents in the array during read operations. Each blocking device is connected to and shared by a group of memory elements in the array.

20 Claims, 8 Drawing Sheets

CROSS POINT MEMORY ARRAY INCLUDING SHARED DEVICES FOR BLOCKING SNEAK PATH CURRENTS

BACKGROUND OF THE INVENTION

The present invention relates to information storage devices. More specifically, the present invention relates to a data storage device including a resistive cross point memory cell array.

Consider the example of a Magnetic Random Access Memory ("MRAM") device including a resistive cross point array of spin dependent tunneling (SDT) junctions, word lines extending along rows of the SDT junctions, and bit lines extending along columns of the SDT junctions. Each SDT junction is located at a cross point of a word line and a bit line. The magnetization of each SDT junction assumes one of two stable orientations at any given time. These two stable orientations, parallel and anti-parallel, represent logic values of '0' and '1.' The magnetization orientation, in turn, affects the resistance of the SDT junction. Resistance of the SDT junction is a first value (R) if the magnetization orientation is parallel and a second value (R+ΔR) if the magnetization orientation is anti-parallel. The magnetization orientation of the SDT junction and, therefore, its logic value may be read by sensing its resistance state.

Sensing the resistance state of a single SDT junction in a resistive cross point array can be unreliable. All SDT junctions in the array are coupled together through many parallel paths. The resistance seen at one cross point equals the resistance of the SDT junction at that cross point in parallel with resistances of SDT junctions in the other rows and columns.

Moreover, if the SDT junction being sensed has a different resistance state due to the stored magnetization, a small differential voltage may develop. This small differential voltage can give rise to parasitic or "sneak path" currents. The parasitic currents can interfere with the sensing of the resistance states.

Figure 1:
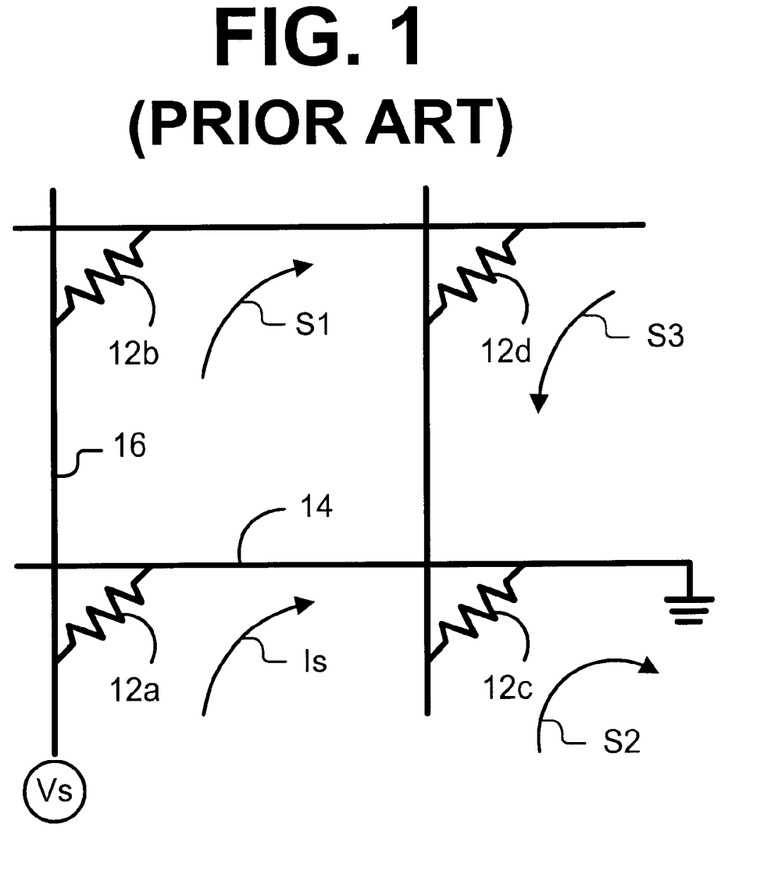
FIG. 1 is an illustration of "sneak path" currents in a resistive cross point array according to the prior art.

Parasitic currents are illustrated in FIG. 1. A selected SDT junction is represented by a first resistor 12$a$, and unselected SDT junctions are represented by second, third and fourth resistors 12$b$, 12$c$ and 12$d$. The selected SDT junction lies at the cross point of selected word and bit lines 14 and 16. The second resistor 12$b$ represents the unselected SDT junctions along the selected bit line 16, the third resistor 12$c$ represents the unselected SDT junctions along the selected word line 14, and the fourth resistor 12$d$ represents the remaining SDT junctions. If, for example, all of the SDT junctions 12 have a nominal resistance of about R and if the array 10 has n rows and m columns, then the second resistor 12$b$ will have a resistance of about R/(n−1), the third resistor 12$c$ will have a resistance of about R/(m−1), and the fourth resistor 12$d$ will have a resistance of about R/[(n−1)(m−1)].

During a read operation, the first resistor 12$a$ may be selected by applying an operating potential Vs to the selected bit line 16 and a ground potential to the selected word line 14. Consequently, a sense current Is flows through the first resistor 12$a$. However, the second, third and fourth resistors 12$b$, 12$c$ and 12$d$ are also coupled between the operating potential Vs and the ground potential; therefore, sneak path currents S1, S2 and S3 can flow through the second, third and fourth resistors 12$b$, 12$c$ and 12$d$. Moreover, the resistances of the second, third and fourth resistors 12$b$, 12$c$ and 12$d$ are much smaller than the resistance of the selected (first) resistor 12$a$; therefore, the sneak path currents S1, S2 and S3 are larger than the sense current $I_s$. Such sneak path currents S1, S2 and S3 can obscure the sense current $I_s$ during a read operation on the selected SDT junction.

There is a need to reliably sense the resistance states of memory elements in MRAM devices. More generally, there is a need to reliably sense the resistance states of memory elements in resistive cross point memory cell arrays.

SUMMARY OF THE INVENTION

According to one aspect of the present invention, a random access memory device includes a resistive cross point array of memory elements, and a sneak path blocking device coupled to the memory elements. The blocking device is shared by a group of the memory elements. Other aspects and advantages of the present invention will become apparent from the following detailed description, taken in conjunction with the accompanying drawings, illustrating by way of example the principles of the present invention.

DETAILED DESCRIPTION OF THE INVENTION

As shown in the drawings for purposes of illustration, the present invention is embodied in an MRAM device including a resistive cross point array of memory elements and a plurality of devices (e.g., diodes, transistors) that can block sneak path currents in the array during read operations. These blocking devices are shared by multiple memory elements. The shared blocking devices offer a more efficient layout than individual blocking devices for the memory elements. The shared blocking devices also offer a higher current capability.

Figure 2:
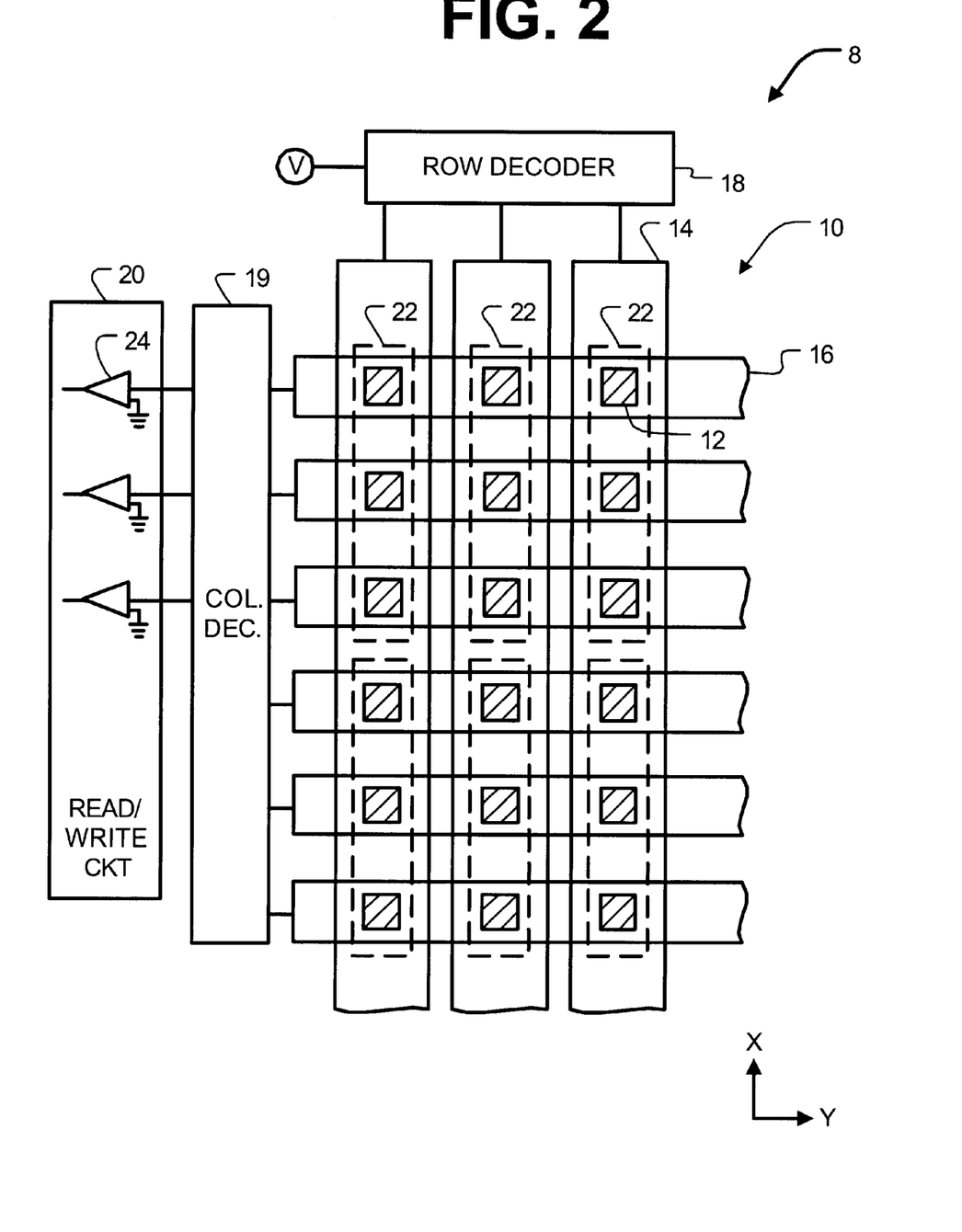
FIG. 2 is a simplified illustration of a shared-diode cross point memory array.

Referring to FIG. 2, an MRAM device 8 includes a resistive cross point array 10 of memory elements 12. The memory elements 12 are arranged in rows and columns, with the rows extending along a y-direction and the columns extending along an x-direction. Only a relatively small number of memory elements 12 are shown to simplify the description of the device 8. In practice, arrays of any size may be used.

Traces functioning as word lines 14 extend along the x-direction in a plane on one side of the array 10. Traces functioning as bit lines 16 extend along the y-direction in a plane on an opposite side of the array 10. There may be one word line 14 for each row of the array 10 and one bit line 16 for each column of the array 10. Each memory element 12 is located at a cross point of a word line 14 and bit line 16.

The memory elements 12 may be SDT junctions or other types of magnetic tunnel junctions. Resistance of each SDT junction is a first value (R) if its magnetization orientation is parallel and a second value (R+ΔR) if its magnetization orientation is anti-parallel Referring to FIG. 3, a magnetic tunnel junction includes pinned and free layers 12a and 12b that are separated by an insulating tunnel barrier 12c. The pinned layer 12a has a magnetization that is oriented in the plane of the pinned layer 12a but fixed so as not to rotate in the presence of an applied magnetic field in a range of interest. The free layer 12b has a magnetization orientation that can be oriented in either of two directions in the plane of the free layer 12b. If the magnetization of the pinned and free layers 12a and 12b are in the same direction, the orientation is parallel. If the magnetization of the pinned and free layers 12a and 12b are in opposite directions, the orientation is anti-parallel.

Figure 3:
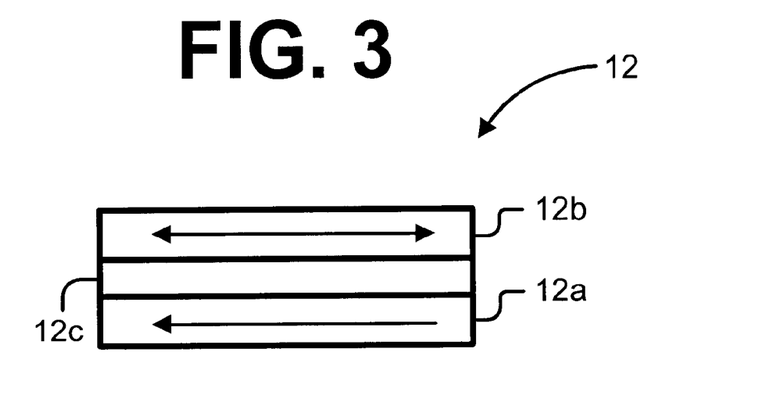
FIG. 3 is an illustration of magnetization orientations of a memory element of the array.

The insulating tunnel barrier 12c allows quantum mechanical tunneling to occur between the pinned and free layers 12a and 12b. This tunneling phenomenon is electron spin dependent, making the resistance of the magnetic tunnel junction a function of the magnetization orientation of the pinned and free layers 12a and 12b.

Returning now to FIG. 2, the MRAM device 8 also includes a row decoder 18 for selecting word lines 14 during read and write operations. The MRAM device 8 further includes a column decoder 19 and associated read/write circuit 20. The read/write 20 circuit senses resistance of selected memory elements 12 during read operations and it orients the magnetization of the selected memory elements 10 during write operations.

The MRAM device 8 further includes a plurality of diodes 22 connected to the memory elements. Each diode 22 is shared by a group of memory elements 12. FIG. 2 happens to show each diode 22 being shared by a group of three memory elements 12. However, the number of memory elements 12 per group is not so limited: each group may have more or fewer than three memory elements 12.

The read/write circuit 20 includes multiple groups of sense amplifiers 24. The number of sense amplifiers 24 per group may correspond to the number of memory elements 12 per group. For example, three sense amplifiers 24 correspond to groups of three memory elements 12, and, during read operations, the column decoder 19 connects the three sense amplifiers 24 to selected groups of three memory elements 12.

Figure 4:
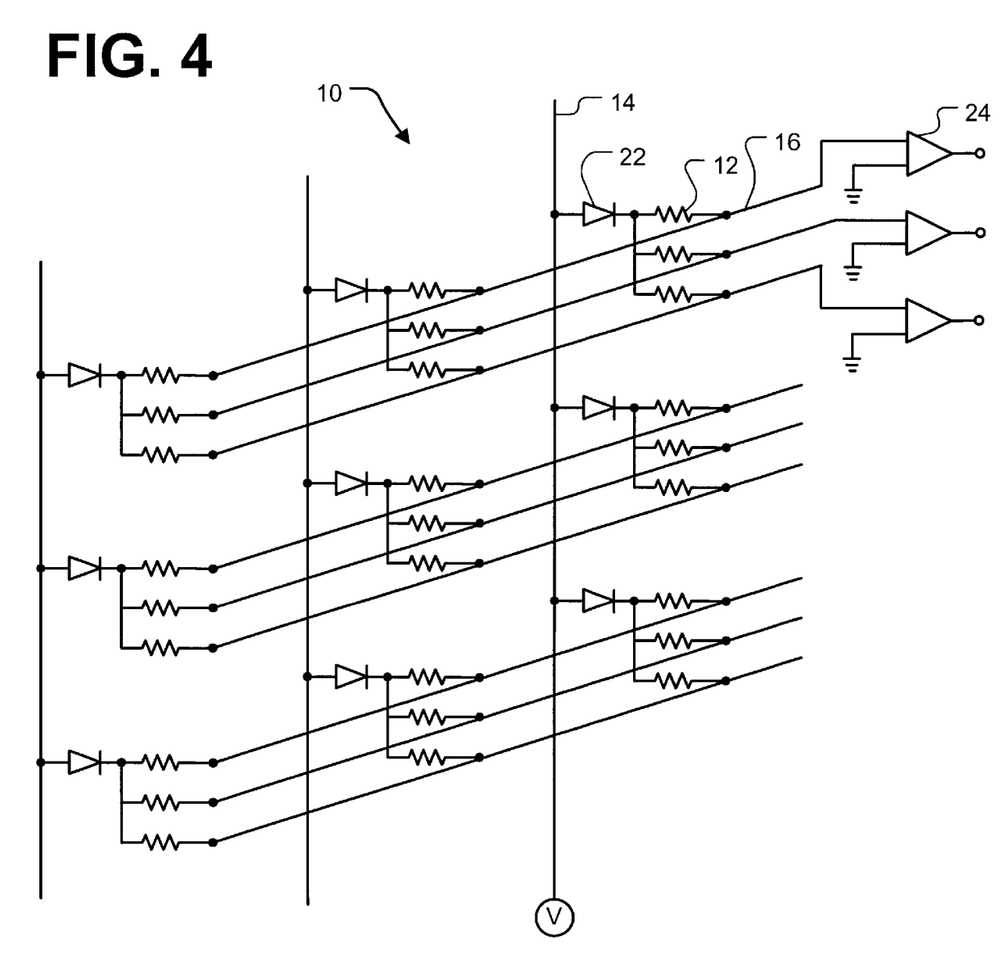
FIG. 4 is an illustration of the memory array as configured for a first type of read operation.

Additional reference is now made to FIG. 4, which illustrates the array 10 as configured for a first type of read operation. During the read operation, the row decoder 18 applies an operating potential (V) to a selected word line 14 and a sense amplifier 24 applies a reference potential to a selected bit line 16, whereby a sense current flows through a shared diode 22 and a selected memory element 12. The sense amplifier 24 senses the current to determine the resistance state and, therefore, the stored logic value, of the selected memory element 12. The diodes 22 prevent any sneak path currents from interfering with the read operation. Multiple groups of memory elements 12 may be sensed simultaneously by connecting multiple groups of sense amplifiers 24 to multiple bit lines 16.

Figure 5:
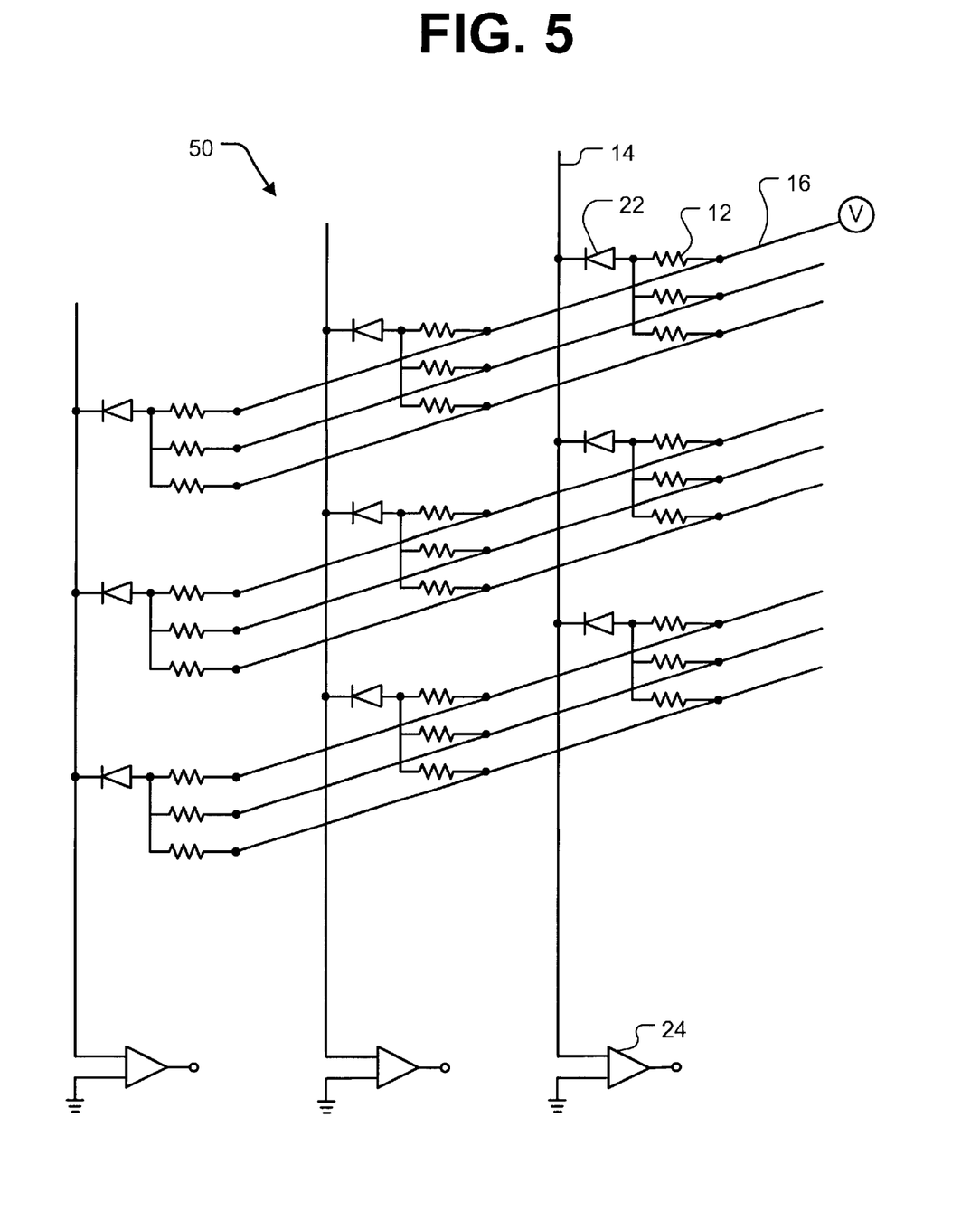
FIG. 5 is an illustration of a memory array configured for a second type of read operation.

Reference is now made to FIG. 5, which illustrates a memory array 50 configured for a second type of read operation. During the read operation an operating potential (V) is applied to a selected bit line 16, and sense amplifiers 24 are connected to the word lines 14. The anodes of the diodes 22 connected to the selected bit line 16 are at the same potential; consequently, current is conducted only by the memory elements 12 connected to the selected bit line 16. These currents flow through the associated diodes 22 and to the associated sense amplifiers 24 without interference from one another. The sense amplifiers 24 sense the magnitude of the currents and determine the resistance (and therefore logic) states of the selected memory elements 12. Because each diode 22 conducts current from only one memory element, the sizes of the memory elements 12 and the diodes 22 can reduced to produce a higher density design.

Figure 6:
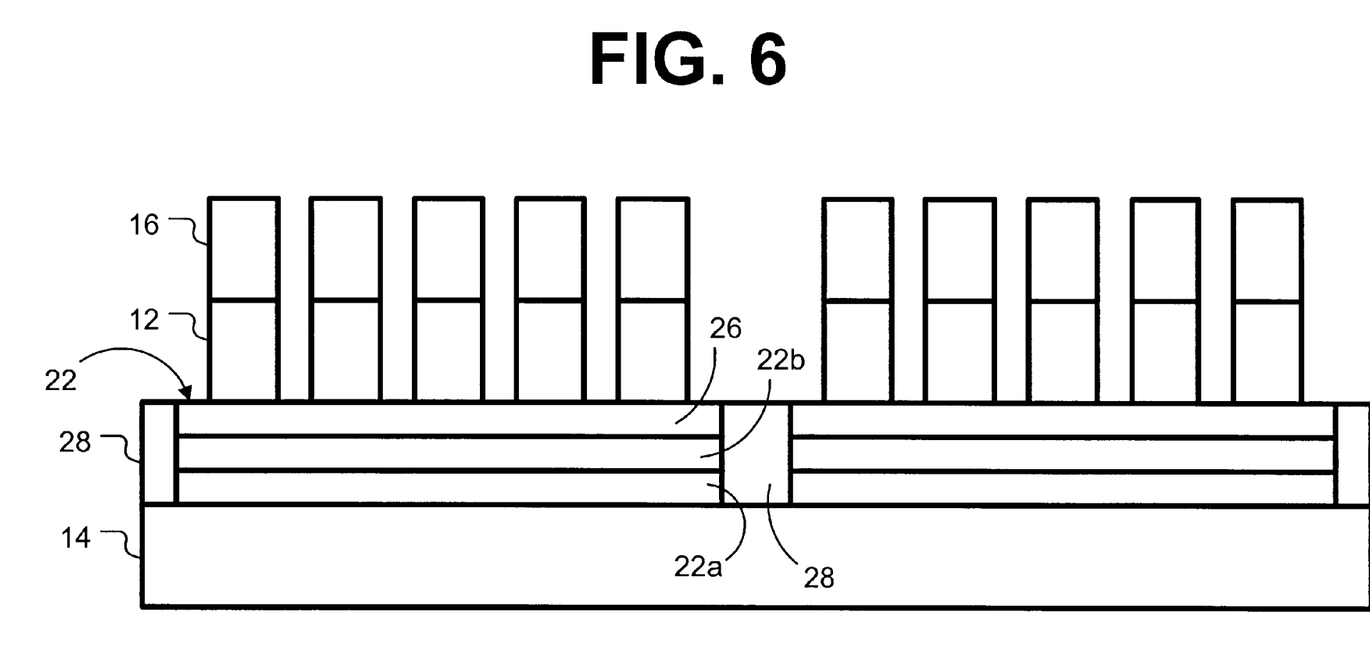
FIG. 6 is a cross-sectional view of a first shared-diode configuration.

Reference is now made to FIG. 6, which illustrates a first shared-diode configuration. A bottom conductor (e.g., a word line) 14 is formed on a silicon substrate (not shown), and a semiconductor layer (e.g., a layer of silicon or amorphous silicon) is formed on the bottom conductor 14. The shared diodes 22 are formed in the semiconductor layer, and intermediate conductive layers 26 are formed on top of the diodes 22. Isolation islands 28 separate the diodes 22 and the intermediate conductive layers 26.

The memory elements 12 are formed on top of the intermediate conductive layers 26. A group of five memory elements 12 for each diode 22 is shown in FIG. 6. Top conductors (e.g., bit lines) 16 are formed on the memory elements 12. The intermediate conductive layer 26, which may be made of a metal such as aluminum or copper, ensures that the memory elements 12 sharing the same diode 22 are at the same potential. The intermediate conductive layer 26 may be made thinner than the top and bottom conductors 14 and 16.

Each diode 22 includes an n-type silicon layer 22a and a p-type silicon layer 22b. Each shared diode 22 spans all of the memory elements 12 of its group.

The shared-diode configuration has a more effective area than a configuration having one diode per memory cell. Moreover, current capability is improved.

Figure 7:
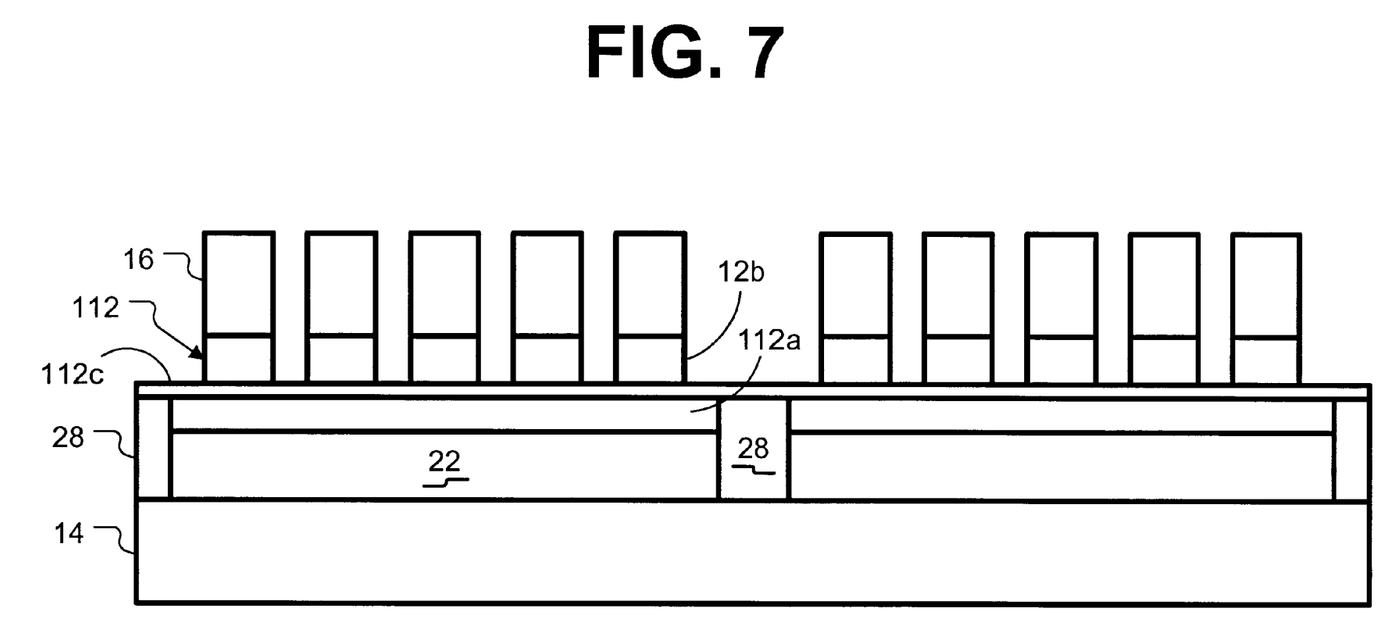
FIG. 7 is a cross-sectional view of a second shared-diode configuration.

Reference is now made to FIG. 7, which illustrates a second shared-diode configuration. A bottom conductor 14 is formed on a silicon substrate and shared diodes 22 are formed atop the bottom conductor 14. An intermediate layer is not formed on the shared diodes 22. Instead, a common or shared pinned layer 112a is formed atop each diode 22, and a common or shared tunnel barrier 112c is formed across the pinned layers 112a. Isolation islands 28 separate the diodes 22 and the shared pinned layers 112a. Individual free layers 12b are formed atop the shared tunnel barrier 112c, and word lines 16 are formed atop the free layers 12b.

Figure 8:
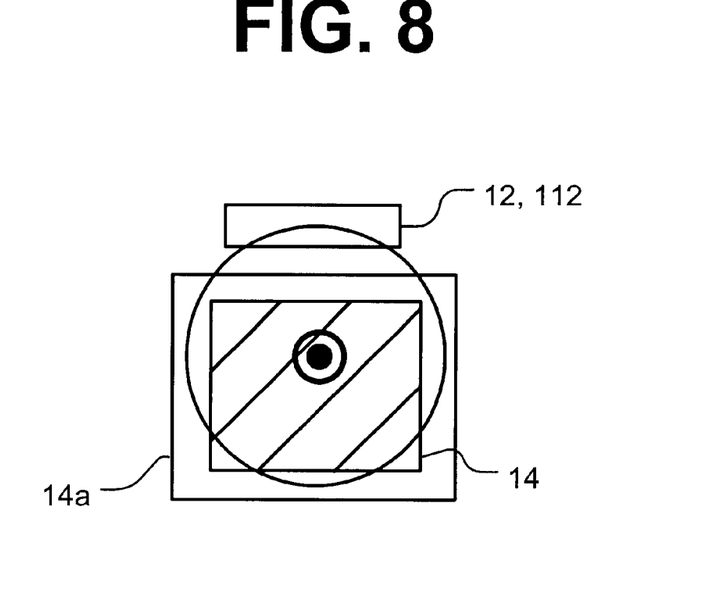
FIG. 8 is an illustration of a conductor clad with magnetic material for enhancing a magnetic field induced by a write current.

As shown in FIGS. 6 and 7, the shared diodes 22 move the bottom conductor 14 further away from the memory elements 12, 112. To avoid a substantial loss in magnetic field during write operations, the bottom conductor 14 may be clad with a material 14a such as nickel-iron (NiFe) (see FIG. 8). The cladding 14a directs the write magnetic field into the memory element 12, 112.

Figure 9:
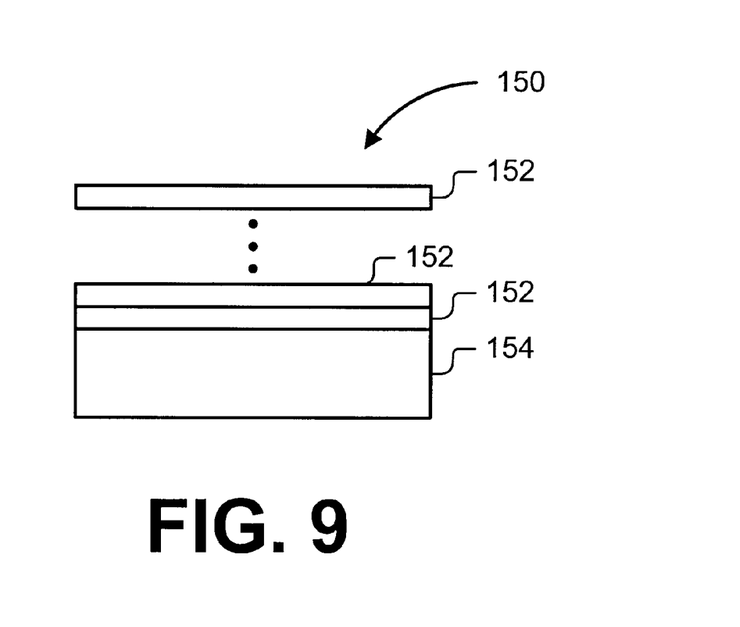
FIG. 9 is an illustration of a chip including multiple planes of shared-diode cross point memory arrays.

Reference is now made to FIG. 9, which illustrates a chip 150 having multiple levels or planes 152 of resistive cross point memory cell arrays. Each plane 152 includes shared diodes for blocking sneak path currents. The planes 152 are stacked on a substrate 154 and separated by insulating material (e.g., alumina, glass). The diodes may be made of an amorphous semiconductor material, which can be formed on a conductor such as copper.

Read and write circuits may be fabricated on the substrate 154. The read and write circuits may include additional multiplexers for selecting the levels that are read from and written to.

The present invention is not limited to three or five memory elements sharing the same diode. Diode groups of other sizes may share the same diode.

The present invention is not limited to the sense schemes described above. The memory elements may be sensed in a variety of ways.

The present invention is not limited to magnetic tunnel junction memory elements. Other types of thin film elements may be used. For example, the memory elements may be polymer memory elements or ferroelectric memory elements.

Figure 10:
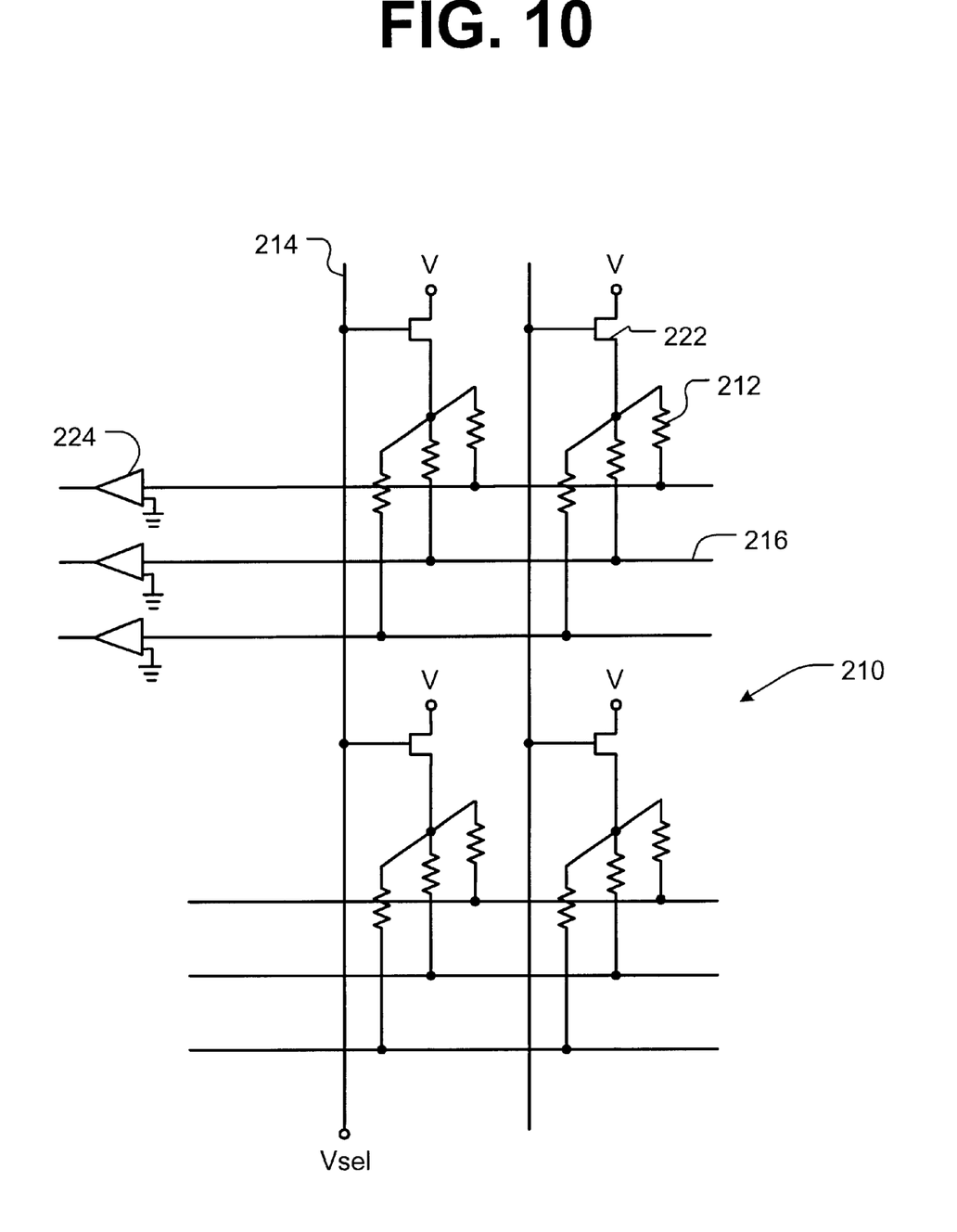
FIG. 10 is a simplified illustration of a shared-transistor cross point memory array.

The present invention is not limited to diodes for blocking sneak path currents. Other types of blocking devices may be used. For instance, transistors may be used instead of the diodes. Referring to FIG. 10, a memory array 210 includes m word lines 214, n bit lines 216 and n×m memory elements 212. Each transistor 222 is shown as being shared by a group of three memory elements 212. Each memory element 212 is connected between a bit line 216 and the drain of its shared transistor 222. The gate of each transistor 222 is connected to a word line 214, and the source of each transistor 222 receives an operating potential (V). During a read operation, a voltage (Vsel) is applied to a selected word line 214, whereby the transistors 222 connected to the selected word line 214 are turned on. One bit line 216 is selected for each group, and a reference potential is applied to each selected bit line 216 by a corresponding sense amplifier 224. Sense currents flow through the transistors 222 and the associated sense amplifiers 224 without interference from one another. The sense amplifiers 224 sense the magnitude of the current and determine the resistance (and therefore logic) states of the memory elements 212.

The present invention is not limited to the specific embodiments described and illustrated above. Instead, the present invention is construed according to the claims that follow.

What is claimed is:

1. An information storage device comprising
   a resistive cross point array of memory elements; and
   a sneak path current blocking device coupled to and shared by a group of the memory elements.
2. The device of claim 1, wherein the blocking device includes a diode.
3. The device of claim 2, wherein the diode includes first and second semiconductor layers of opposite polarity, each layer spanning all of the memory elements in the group.
4. The device of claim 1, wherein the blocking device includes a transistor.
5. The device of claim 1, wherein the memory elements are magnetic tunnel junctions.
6. The device of claim 1, further comprising a conductive layer on the blocking device, the memory elements in the group being atop the conductive layer.
7. The device of claim 1, wherein the memory elements in the group are in direct contact with the blocking device.
8. The device of claim 7, wherein the memory elements in the group include a shared pinned layer in direct contact with the blocking device; a shared tunnel barrier atop the shared pinned layer; and individual free layers atop the shared tunnel barrier.
9. The device of claim 1, wherein additional groups of memory elements and their corresponding blocking devices are formed on at least one additional plane of the information storage device; and wherein the blocking devices are made of an amorphous material.
10. An MRAM device comprising:
    an array of magnetic tunnel junctions; and
    a plurality of sneak path blocking devices connected to the magnetic tunnel junctions, each blocking device being shared by a group of magnetic tunnel junctions.
11. The device of claim 10, further comprising conductive layers intermediate the blocking devices and the memory elements.
12. The device of claim 10, wherein the memory elements are in direct contact with the blocking devices.
13. The device of claim 12, wherein the memory elements of a group include a shared pinned layer in direct contact with their associated blocking device; a shared tunnel barrier atop the shared pinned layer; and individual free layers atop the shared tunnel barrier.
14. The device of claim 10, wherein the blocking devices are formed between the memory elements and traces clad with a magnetic field-enhancing material.
15. The device of claim 10, further comprising sense amplifiers, coupled to the blocking devices, for determining the resistance states of selected memory elements during write operations.
16. The device of claim 15, further comprising word and bit lines for the array; wherein during read operations on selected memory elements, an operating potential is applied to selected word lines and the sense amplifiers apply a reference potential to selected bit lines, whereby sense currents flow through the shared blocking devices and selected memory elements; and wherein the sense amplifiers sense the currents to determine the resistance states of the selected memory elements.
17. The device of claim 15, further comprising word and bit lines for the array; wherein during read operations a voltage is applied to a selected bit line and the sense amplifiers are connected to the word lines such that anodes of the blocking devices connected to the selected bit line are at the same potential.
18. The device of claim 10, wherein the blocking devices include diodes.
19. The device of claim 10, wherein the blocking devices include transistors.
20. A memory device comprising:
    a resistive cross point array of memory elements; and
    a plurality of means for blocking sneak path currents during read operations on selected memory elements in the array, each blocking means being shared by at least two memory elements.

* * * * *